United States Patent [19]
Swafford et al.

[11] Patent Number: 6,040,701
[45] Date of Patent: Mar. 21, 2000

[54] THIN PROFILE VERTICALLY ORIENTED PROBE ADAPTER

[75] Inventors: M. David Swafford, Hillsboro; James M. Fenton, Tigard, both of Oreg.

[73] Assignee: Tektronix, Inc., Beaverton, Oreg.

[21] Appl. No.: 09/099,076

[22] Filed: Jun. 17, 1998

[51] Int. Cl.[7] .................................................. G01R 31/02
[52] U.S. Cl. ............................................ 324/754; 324/761
[58] Field of Search ..................................... 324/755, 754, 324/761, 762, 158.1, 73.1; 439/55, 482; 361/683, 777, 791

[56] References Cited

U.S. PATENT DOCUMENTS 3,675,083  7/1972  White .................................. 439/55
4,417,204  11/1983  Dehmel et al. .......................... 324/537

*Primary Examiner*—Vinh P. Nguyen
*Attorney, Agent, or Firm*—Thomas F. Lenihan

[57] ABSTRACT

An apparatus for providing a probing interface for a circuit under test exhibits a relatively narrow profile and a vertical orientation so that it does not block access to connectors in adjacent slots. The vertical orientation is made possible by the use of a circuit material comprising alternate sections of flexible material and rigid material. Advantageously, the signal lines between the circuit card under test and its motherboard are direct and relatively short, and the probing connection points are isolated from the direct signal lines by a plurality of isolation resistors.

2 Claims, 4 Drawing Sheets

THIN PROFILE VERTICALLY ORIENTED PROBE ADAPTER

FIELD OF THE INVENTION

The subject invention concerns the field of expander cards in general, and specifically concerns probe adapters suitable for use with logic analyzers.

BACKGROUND OF THE INVENTION

When using many electronic test and measurement equipment products, such as, oscilloscopes, logic analyzers, communication systems protocol analyzers, spectrum analyzers, and the like, to troubleshoot a circuit under test, it is quite common to employ a circuit card extender to elevate a particular circuit card and thereby facilitate connection of test probes to the circuit under test (sometimes referred to as a System Under Test, or SUT). In the distant prior art, this feature was implemented by providing a board with a card edge connector on one end, a card edge receptacle on the other end, and a plurality of printed traces running straight across the board from the card edge to the receptacle. Probing was performed directly on the circuit board under test.

A probing adapter is nonintrusive hardware that allows a logic analyzer to acquire data from a bus in its own operating environment with little, if any, effect on the target system. A probing adapter comprises a circuit board and a socket for a circuit card to be tested. A probing adapter plugs into a bus receptacle on the target system and signals from the system bus flow through the probing adapter to a logic analyzer. Modern probing adapters must support logic analyzers which have the capability of monitoring a large number of channels (for example 136 channels), simultaneously. Consequently, in addition to elevating the circuit under test from its motherboard, by interposing between the circuit under test and its normal connector on the motherboard, a probing adapter also provides connection points (i.e., sockets) for high density multiconductor probes.

Unfortunately, prior art probing adapters suffered from several disadvantages. Among these disadvantages are: signal reflections caused by impedance mismatches due to the use of the connectors to turn the probe adapter from a vertical orientation to a horizontal orientation for use, and blocking of adjacent slots due to the horizontal orientation of the probing adapter. A probe adapter exhibiting these disadvantages is the FSAGP 32TE AGP Probe manufactured for Hewlett Packard Inc. by FuturePlus Systems Corporation, Colorado Springs, Colo.

What is needed is a probing adapter which does not block adjacent slots and which does not introduce impedance mismatches which would otherwise cause reflective events.

SUMMARY OF THE INVENTION

An apparatus for providing a probing interface for a circuit under test exhibits a relatively narrow profile and a vertical orientation so that it does not block access to connectors in adjacent slots. The vertical orientation is made possible by the use of a circuit material comprising alternate sections of flexible material and rigid material. Advantageously, the signal lines between the circuit card under test and its motherboard are direct and relatively short, and the probing connection points are isolated from the direct signal lines by a plurality of isolation resistors.

DETAILED DESCRIPTION OF THE INVENTION

Figure 1:
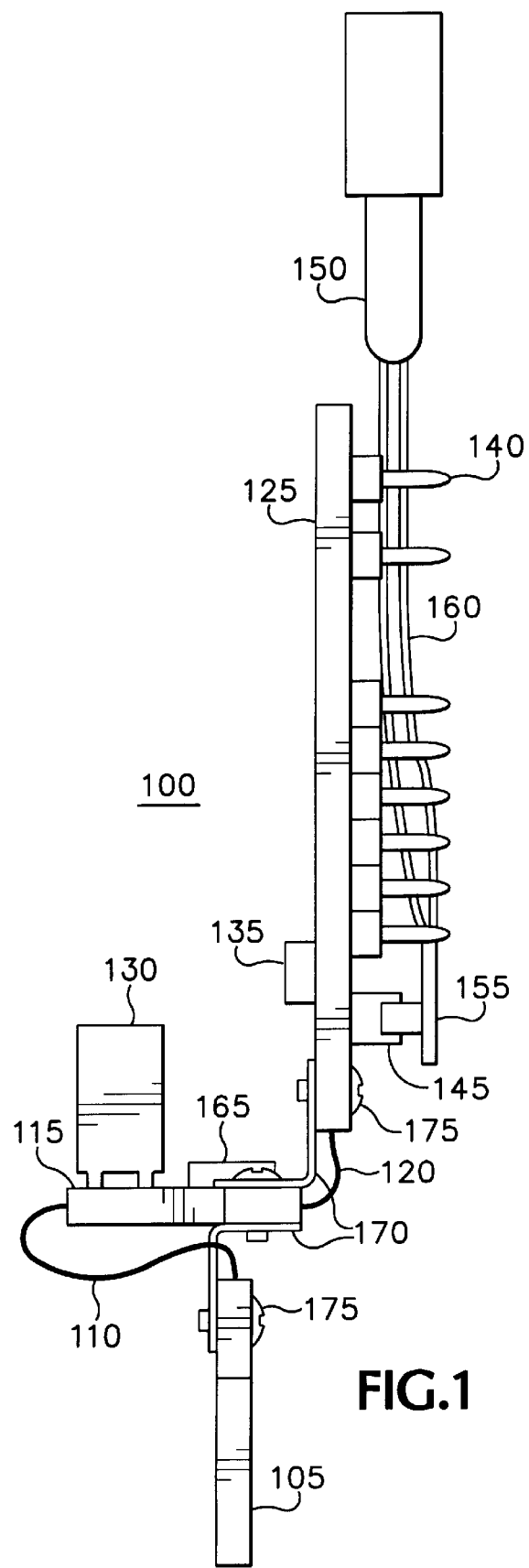
FIG. 1 shows an embodiment of a thin profile vertically oriented probing adapter according to the invention.

Referring to FIG. 1, a thin (or narrow) profile vertically oriented probing adapter 100 is shown. Adapter 100 comprises a first rigid section 105 having connector pads (not shown in FIG. 1) formed thereon for connection to a mating receptacle on a motherboard (also not shown in FIG. 1). Adapter 100 further comprises a flexible section 110 for transferring electrical signals between first rigid section 105 and a second rigid section 115, perpendicularly mounted with respect to board section 105. Adapter 100 further comprises a second flexible section 120 for coupling electrical signals between second rigid section 115 and a third rigid section 125.

Adapter 100 includes a mating card edge receptacle 130 mounted on second rigid section 115 for receiving a circuit card to be tested, and for supporting the circuit card to be tested in the same vertical orientation it exhibits when plugged directly into the motherboard. Adapter 100 is preferably made using a "rigid-flex" circuit material, which is readily available from a variety of circuit board manufacturers.

Many high reliability applications call for durability and high temperature which often require a rigid-flex circuit. A rigid flex is basically a flexible circuit integrated into a multilayer rigid construction. The flexible layers extend through the rigid portions allowing the holes to be plated through directly from the outside rigid layers to the internal flex layers. This is often the best solution from a packaging standpoint. The rigid sections are ideal for component and connector mounting, while protruding flexible portions allow flexing for installation and there are no connectors required at the flex-to-board interfaces. Mechanically you get the best of both worlds. The flexible portion of this material passes through the interior of the rigid sections and is superior to using connectors arranged at right angles to pass signals between perpendicularly mounted circuit boards. This is so because the impedance of the signal lines is maintained substantially constant and thus no reflective event transition is introduced. The use of rigid-flex techniques also avoids the added capacitance which would accompany the use of right angle connectors.

Note that the distance between the lower end of rigid section 105 and receptacle 130 is relatively short, about 1.5 inches in actual practice. This relatively short distance advantageously reduces the round trip time delay for the signals passing between the circuit under test and the motherboard. It is also important to note that there are no intervening components between the motherboard and the circuit under test.

Rigid section 125 may have electronic components 135 mounted thereon for specific purposes when testing specific boards. Such components are not necessary to the invention and will not be described. Rigid section 125 may also have one or more test points 140 mounted thereon for individual probing, but the main connection point for test and measurement is via one or more high density connectors 145. A probe 150, having a right angle head 155 is shown connected to high density connector 145. A bundle of test probe leads 160 connects between head 155 and probe body 150.

It is important to isolate the test probe from the circuit under test so as not to introduce significant loading. In this regard, each of the pins of receptacle 130 is coupled to probe head 155 via a respective series connected isolation resistor, generally designated 165. The value of each of the plurality of series connected isolation resistors 165 is preferably 180 ohms. Probing adapter 100 is held in position by mounting brackets 170 and screws or rivets 175.

The thin profile enables a probing adapter according to the subject invention to be used where the spacing between connectors on the motherboard is as little as 0.8 inches. This feature is extremely important because it allows testing of the circuit under test while the card in the next adjacent slot is plugged into its receptacle in the motherboard. No other probing adapter allows such operation.

Figure 2:
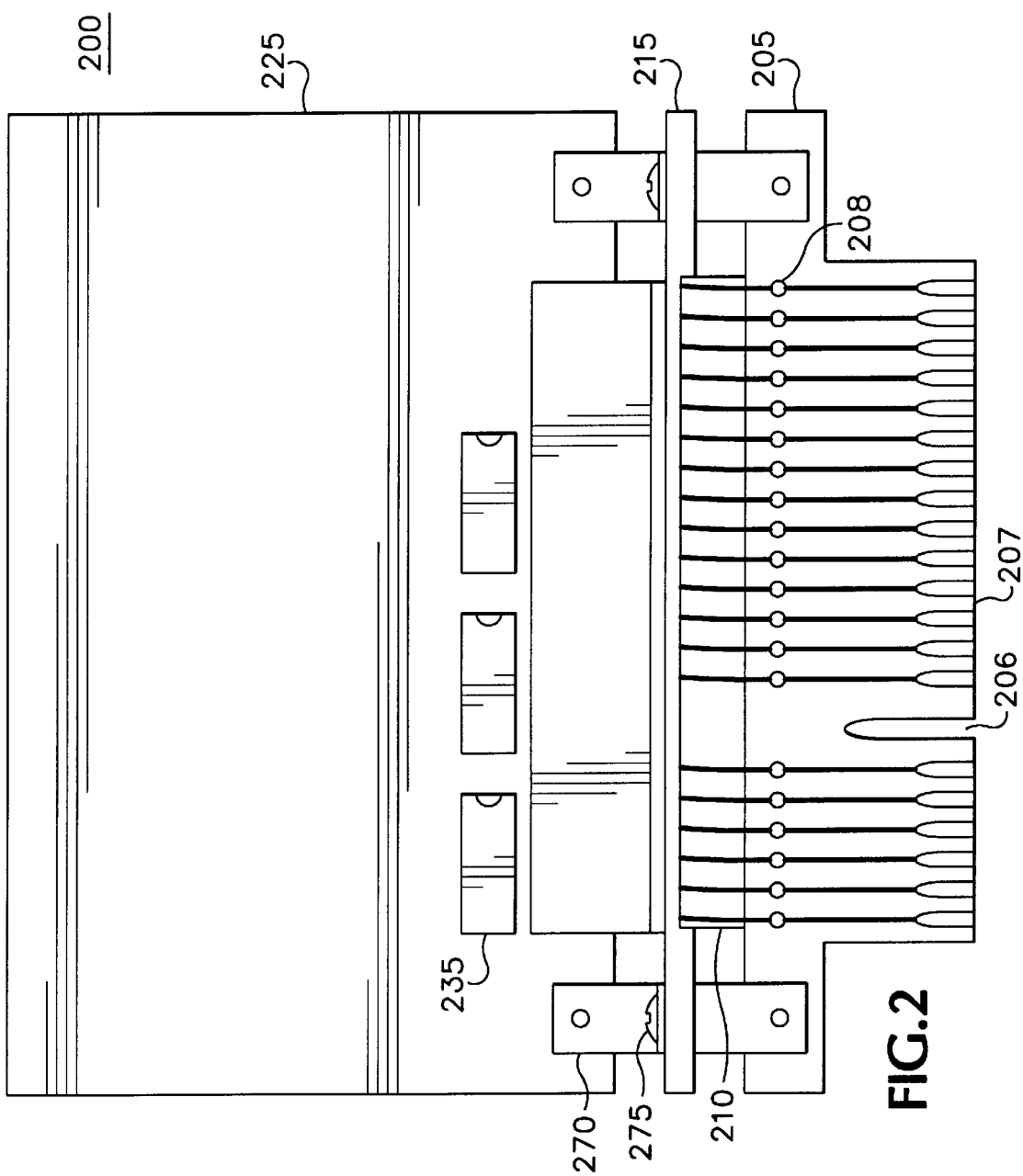
FIG. 2 shows a front view of the embodiment of FIG. 1.

A front view of probing adapter 100 of FIG. 1 is shown in FIG. 2 wherein elements which bare similar numbers to elements in FIG. 1 serve similar functions which will not be described again. First rigid section 205 of probing adapter 200 includes a keyway 206 for guiding insertion into a receptacle on the motherboard, and for preventing backwards insertion. Rigid section 205 has connector pads generally designated 207 plated thereon to make electrical connection to the receptacle pins when probing adapter 200 is inserted into the receptacle (not shown in this FIGURE) on the motherboard. Each of the signals on each of connector pads 207 are conveyed to the interior of rigid section 205 by way of a via (i.e., a plated through hole) generally designated 208 which makes contact with both the printed trace leading to a contact pad 207 and to the flexible circuit material occupying an interior layer of rigid section 207.

Figure 3:
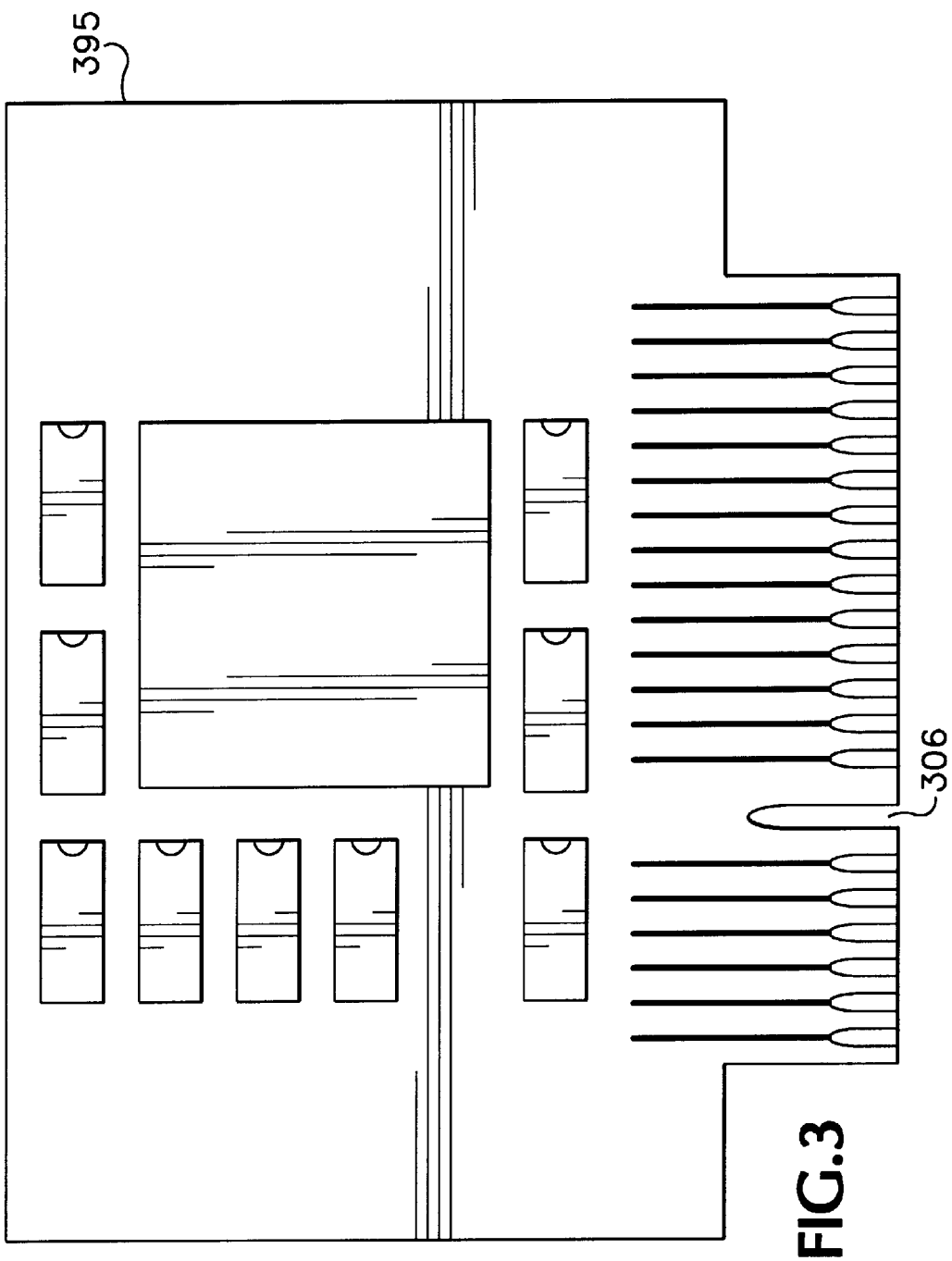
FIG. 3 shows a simplified card representing a circuit to be tested.

FIG. 3 shows a simplified representation of a circuit board to be tested. Note that it has the same keyway 306 in the same position for mating with its receptacle on the motherboard.

Figure 4:
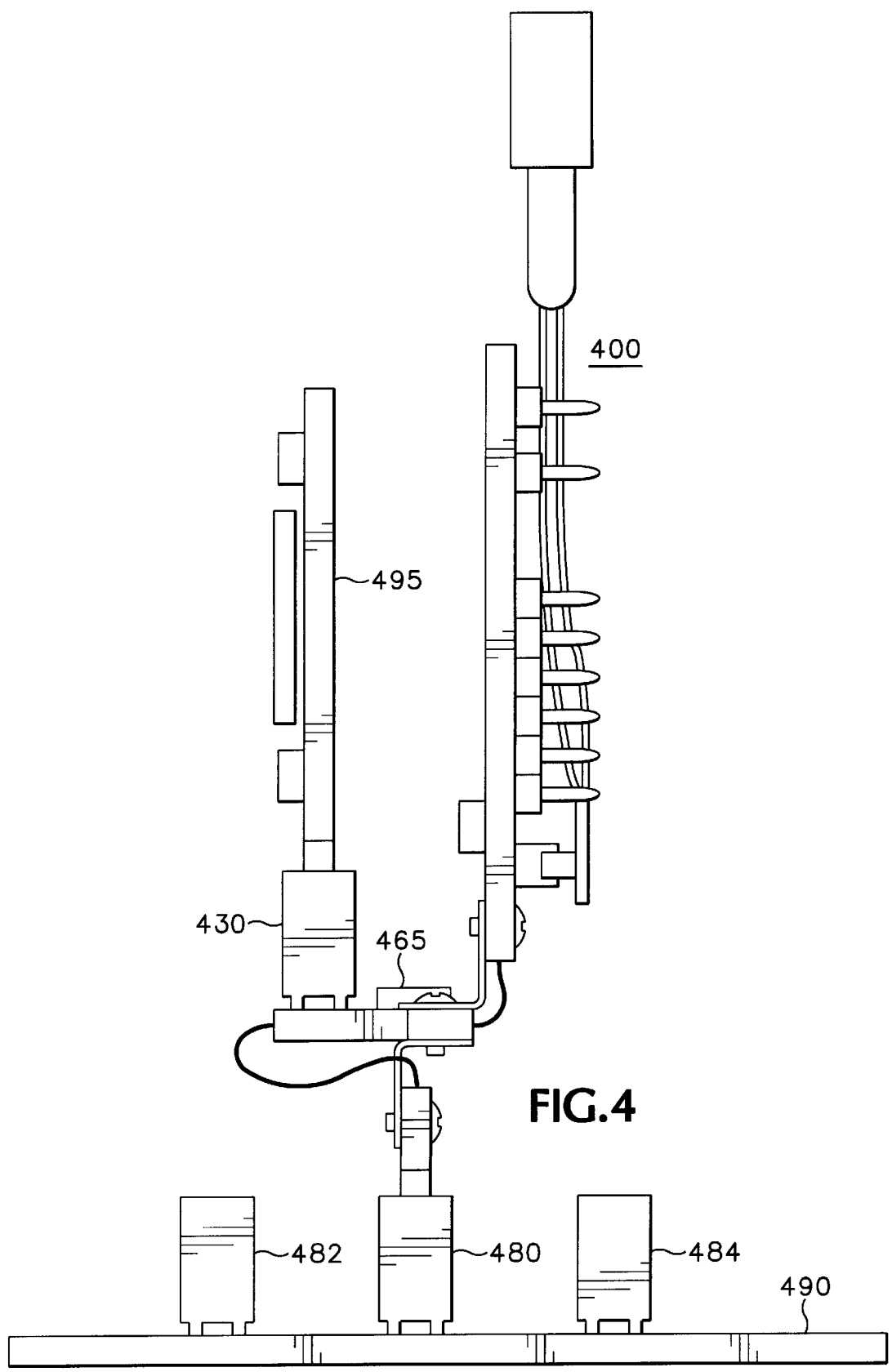
FIG. 4 shows the embodiment of FIG. 1 in use with a circuit card under test.

Referring to FIG. 4, a probing adapter 400 according to the invention is shown inserted into a receptacle 480 of a motherboard 490. Elements which bare similar numbers to elements in FIG. 1 serve similar functions which will not be described again. Note that a circuit board to be tested (for example, the circuit board of FIG. 3) has been inserted into test receptacle 430. Circuit board 495 is coupled to its motherboard without any intervening components over a connection run which is only about 1.5 inches in length, and should function in the same manner as if it were plugged into its motherboard receptacle directly. It is important to note from FIG. 4 that circuit boards may be plugged into adjacent motherboard receptacles 482 and 484, a valuable feature that was hereto fore unavailable to the test engineer.

Thus, there has been described a probing adapter device for connecting to and supporting in a vertical direction, a circuit under test. As a result of using the subject invention, one can test the circuit under operating conditions with boards inserted into adjacent receptacles on the motherboard.

While the invention has been described with respect to connection to a logic analyzer, it is herein recognized that it is also applicable to other types of test and measurement instruments, such an oscilloscope, a spectrum analyzer, or the like, and such modification is deemed to lie within the scope of the following claims.

What is claimed is:

1. A probe adapter for providing a testing interface between a circuit board under test and a test instrument, comprising:

a first rigid circuit board member for connecting to a first receptacle on a motherboard;

a second rigid circuit board member mounted perpendicular to said first rigid circuit board member for supporting a second receptacle for receiving a circuit under test and supporting said circuit test in a vertical orientation parallel to said first rigid circuit board member;

a first flexible circuit board member for connecting signals between said first and second rigid circuit board members, a third rigid circuit board member for coupling signals from said receptacle supporting said circuit board under test to said test instrument; and a second flexible circuit board member for coupling signals between said second and third rigid circuit board members.

2. The circuit of claim 1 further including a plurality of isolation resistors, each of which is coupled in series between contact pins of said receptacle for supporting said circuit board under test and said second flexible circuit board member.

* * * * *